United States Patent [19]
Yasuda et al.

[11] Patent Number: 5,260,899
[45] Date of Patent: Nov. 9, 1993

[54] SENSE AMPLIFIER FOR SEMICONDUCTOR MEMORY DEVICE

[75] Inventors: Hirofumi Yasuda; Akira Uematsu, both of Nagano, Japan

[73] Assignee: Seiko Epson Corporation, Tokyo, Japan

[21] Appl. No.: 767,965

[22] Filed: Sep. 30, 1991

Related U.S. Application Data

[63] Continuation of Ser. No. 527,670, May 21, 1990, abandoned, which is a continuation of Ser. No. 119,766, Nov. 12, 1987, abandoned, which is a continuation-in-part of Ser. No. 114,311, Oct. 27, 1987, abandoned.

[30] Foreign Application Priority Data

Nov. 14, 1986 [JP] Japan .................. 61-271408
Jun. 22, 1987 [JP] Japan .................. 62-154841

[51] Int. Cl.⁵ .................. G11C 7/00; G11C 11/407
[52] U.S. Cl. .................. 365/189.01; 365/190; 365/207; 365/208
[58] Field of Search ........... 365/203, 205, 207, 208, 365/189.01, 189.11, 189.09, 190; 307/530

[56] References Cited
U.S. PATENT DOCUMENTS

| | | | |
|---|---|---|---|
| 4,670,675 | 6/1987 | Donoghue | 365/208 X |
| 4,725,984 | 2/1988 | Ip et al. | 365/189.01 |
| 4,815,040 | 3/1989 | Matsuz et al. | 365/208 X |

OTHER PUBLICATIONS

"An 80ns 1MB ROM" by Fujio Masuoka, et al., 1984 IEEE International Solid-State Circuits Conference, pp. 146, 147 and 329.

"4M Bit Mask ROM And The Application Therefore" by Shoichi Tsujita Electronic Parts and Materials, published Jan. 1, 1986, pp. 104-108.

*Primary Examiner*—Alyssa H. Bowler
*Attorney, Agent, or Firm*—Blum Kaplan

[57] ABSTRACT

A semiconductor memory device for reading data from a selected memory cell. The memory cells are arranged in an array. First bit lines and word lines, coupled to the memory cells, are arranged in a matrix. The word lines select the selected cell. An amplification circuit amplifies the current passing through the selected memory cell and is coupled to the first bit. A second bit line is coupled to the amplification circuit and carries the amplified current. A sensing circuit coupled to the second bit line senses the current on the second bit line. As a result, the current passing through the selected memory cell is detected.

56 Claims, 5 Drawing Sheets

SENSE AMPLIFIER FOR SEMICONDUCTOR MEMORY DEVICE

This is a continuation of application Ser. No. 07/527,670, filed May 21, 1990, now abandoned, which is a continuation of application Ser. No. 07/119,766, filed Nov. 12, 1987, now abandoned, which is a continuation-in-part of application Ser. No. 07/114,311, filed Oct. 27, 1989 now abandoned.

BACKGROUND OF THE INVENTION

The invention is generally directed to a semiconductor device and in particular to an improved bit line structure and data reading circuit in a semiconductor memory device.

In semiconductor memory devices formed of MOS transistors, a mask ROM is used to write data by use of a photoetching mask in the manufacturing process. In addition, EPROM and EEPROM devices having a floating gate structure also utilize MOS transistors as the basis of the memory cell. Because mask ROM's have the simplest structure and are easiest to understand, they are used for purposes of explanation. A mask ROM's structure is shown, for example, in 1984, ISSCC DIGEST OF TECHNICAL PAPERS pages pp 146–47, 329 (FIGS. 3–4) (hereafter "the article"). Word lines are used to connect the outputs of the row decoder to input signals A7–A16 of the address signal. Each of the above word lines is divided into two components, an upward and a downward line. Then one of the divided word lines for a 512×2 memory cell array is selected, becoming a high level signal. One of the 128 output lines to every upward and downward section is selected by the column decoder based on the input of address signals A0–6 and A14 going to a high level. In addition, one of the column transmission N-channel MOS transistors goes to an ON state. As a result, one memory cell selected from the two 512×128 memory cells is selected by row decoder and the column decoder and connected to the sensing amplifier.

In a mask ROM, data writing is performed by using a photoetching mask in the manufacturing process. In the mask ROM described in the above referenced article, a through hole is prepared and binary data is then written based on the connection or absence of the connection between the bit line and the source (power source terminal) of a MOS transistor which forms the memory cell. In other words, binary data is written (a binary "1") or not written (a binary "0") by the creation of a MOS transistor which provides or does not provide a current path from the power source terminal, which is connected to the source electrode of the selected memory cell, through the drain electrode to the bit line and then to the sensing amplifier. The sensing amplifier determines the presence of current or the absence of a current. The greater the magnitude of the current provided to the sensing amplifier, the quicker a reading determination can be made.

Assuming a connection hole in the selected memory cell exists and the drain electrode and bit line are connected, the bit line is reduced to a low potential level when the memory cell is selected. In addition, the input-output of the MOS inverter is short circuited, thereby reducing the input to the sensing amplifier to a low level signal. Thus, the output of the third MOS inverter (the final output of the sensing amplifier) goes to a high level. On the other hand, where there is no connection hole in the selected memory cell, and as a result there is no current passing from the bit line through the memory cell to the power source terminal, an open state results. Thus, the input of the bit line and the sensing amplifier go to a high level and, as a result, the output of the third MOS inverter goes to a low level. The output of the third MOS inverter shown in FIG. 4 on page 147 of the article is the output of the sensing amplifier.

Binary data can be written as described above by selective creation of contact holes. However, binary data can also be written utilizing the variation in the threshold values of a MOS transistor by use of ion implantation in the channel portion of a memory cell. Another method is by the selective formation of a diffusion layer in the MOS transistor.

In the one megabit mask ROM constructed in accordance with the article described above, 512 of the memory cells are connected to a single bit line. The number of cells actually connected to the bit line by the contact holes varies. However, in the maximum case, all 512 memory cells are connected to a single bit line. In each of these memory cells the bit line is connected to the drain of the MOS transistor through a contact or through hole. As a result of this arrangement, the stray capacitance in all 512 memory cells between the drain of the MOS transistor and the substrate bit line is present. Thus, at its maximum, the stray capacitance between 512 MOS transistors' drain and the substrate and the stray capacitance between the aluminum forming the bit line and the power source terminal is present. Thus, the stray capacitance in the system can become extremely large, which significantly slows down the speed of operation.

When the MOS transistors which form the memory cell are manufactured at the minimum size of the design rule, it is expected that the semiconductor memory device will have a very large number of memory cells in a very small chip area. For example, in the article, the channel width is about 3 $\mu$m and the design rule is 2 $\mu$m. As the MOS transistor, which forms the memory cell, becomes smaller, the admittance, or ability to pass current, of the MOS transistor is reduced, thereby increasing the memory access time.

The one megabit structure described in the article is produced with an access time which is within an acceptable range. However, as further increases in integration and miniaturization of semiconductor memory devices occurs, a further reduction in size of the channel of the memory cell which reduces the admittance of the MOS transistor and the ability to carry current will necessarily result. Further, the stray capacitance added to the bit line increases due to the expected increase in the number of memory cells which are connected to the bit line, further reducing the operating speed of the semiconductor memory device. In addition, the power consumption resulting from wiring and the stray capacitance tends to increase.

The one megabit semiconductor memory device described in the article reduces the stray capacitance on the bit line by dividing the memory cell array into two sub-arrays, placing a column transmission transistor and sensing amplifier between the two sub-arrays. However, to divide the array into a larger number of groups utilizing the structure disclosed poses the need to increase the number of column transmission transistors and sensing amplifiers as well as requiring an increase in the amount of wiring regions, e.g. the sensing amplifier output lines. On an overall basis, it will cause an increase in the chip size which is costly and undesirable.

Accordingly, there is a need for an improved semiconductor memory device which is highly integrated and operates at high speed by reducing the stray capacitance of the bit line and allowing the bit line to be driven by a relatively large current even when the size of memory cell is reduced from those produced in accordance with the present state of the art of miniaturization.

SUMMARY OF THE INVENTION

The invention is generally directed to a semiconductor memory device for reading data from a selected memory cell. Memory cells are arranged in an array. A first bit line, coupled to the memory cells, and word lines are arranged in a matrix to select the selected cell. The semiconductor memory device includes amplification circuitry for amplifying the current passing through the selected memory cell. The amplification circuitry is coupled to the first bit line. A second bit line is coupled to the amplification circuitry for carrying the amplifier current. A sensing circuit coupled to the second bit line senses the current passing through the selected memory cell.

Accordingly, it is an object of the invention to provide an improved semiconductor memory device for reading data from a selected memory cell.

Another object of the invention is to provide an improved semiconductor memory device which amplifies the current on the bit line to aid in sensing the data stored in a selected memory cell.

A further object of the invention is to provide a semiconductor memory device wherein a plurality of first bit lines are connected through a current amplification circuit to a second bit line to improve the speed of sensing data and accordingly the reading operation.

Yet another object of the invention is to provide a semiconductor memory device where stray capacitance of a second bit line is substantially reduced so that any remaining stray capacitance is overriden by the amplifying current from the memory cell so that high speed reading is realized even where the memory cell array is not subdivided, and the size of the chip is not significantly increased.

Still another object of the invention is to reduce the power consumption of the semiconductor memory device by reducing the stray capacitance of the bit line.

Yet another object of the invention is to provide an improved semiconductor memory device utilizing a multi-layered bit line structure which realizes high speed operation and low power consumption by increasing the admittance of the second bit line wiring layer.

Yet a further object of the invention is to provide an improved semiconductor memory device including an inverting amplifier and bit line charge control MOS transistor to the current amplification circuit to increase voltage stability of the bit line while reducing the need to increase the number of first bit lines.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

DETAILED DESCRIPTION OF THE PREFERRED EMBODIMENTS

Figure 1:
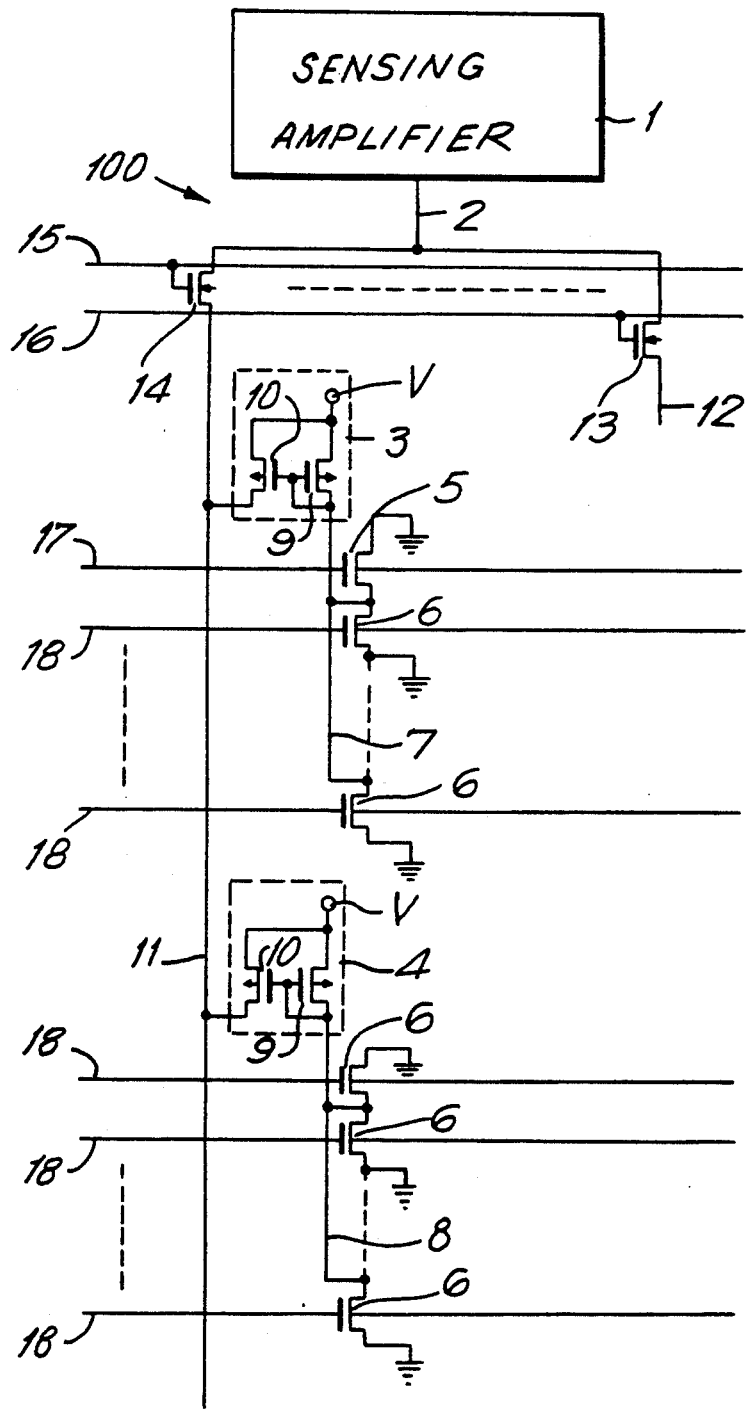
FIG. 1 is a partial circuit diagram of a semiconductor memory device in accordance with a first embodiment of the invention.

Reference is made to FIG. 1 wherein a semiconductor memory device, generally indicated as 100, constructed in accordance with a first embodiment of the invention is depicted. A sensing amplifier 1 is coupled to a second bit line select circuit output terminal 2. A bit line select circuit is composed of N-channel MOS transistors 13 and 14. Column decoder output lines 15 and 16 are coupled to the gate electrodes of transistors 14, 13, respectively. Second bit lines 11, 12 are coupled to output terminal 2 through the source-drain paths of transistors 14, 13, respectively. Current amplification circuits 3, 4 are coupled between first bit lines 7, 8 and second bit line 11. In FIG. 1 only two current amplifications circuits are shown attached to second bit line 11. However, in practice more than two current amplification circuits can and would likely be attached to a single second bit line and similar amplification circuits would be attached to second bit line 12.

Each of N-channel MOS transistors 5, 6 is a separate memory cell with the source-drain path of the memory cell connected between ground and a first bit line 7, 8. The gate electrodes of the memory cells 5, 6 are coupled to the row decoder output line 17, 18 (word lines).

Current amplifiers 3, 4 are identical and a description of the current amplification circuit utilized will be limited to a description of current amplification circuit 3. Current amplification circuit 3 include two P-channel MOS transistors 9, 10. The source-drain path of transistor 9 is coupled between a power supply terminal voltage V and first bit line 7. The source-drain path of transistor 10 is coupled between power supply terminal voltage V and second bit line 11. The gate electrodes of transistors 9, 10 are coupled together and to first bit line 7.

In FIG. 1, when memory cell 5 is to be selected, word line 17 goes high with the other word lines 18 going low. In addition, column decoder output line 15 goes high with column decoder lines 16 going low so that N-channel MOS transistor 14 selects second bit line 11, connecting it to sensing amplifier 1.

When memory cell 5 is written so that a current path is formed through transistor 5 between first bit line 7 and ground (when a high signal is present on word line 17), a current flows from first bit line 7 to ground. Current proportional to the admittance or ability of transistors 5, 6 to handle current passes through P-channel MOS transistor 9, through memory cell 5 and finally to ground. Since P-channel MOS transistor 9 has its gate and drain terminals connected, the current flowing through the source-drain path of MOS transistor 9 equals the current flowing through memory cell 5 when the voltage across memory cell 5 is equal to the voltage between power source terminal V and the gate electrode of transistor 9. Since the gate electrode of P-channel MOS transistor 10 is coupled to the gate electrode of P-channel MOS transistor 9, the current flowing through memory cell 5 is current amplified by transistor 10. The degree of amplification is dependent upon the relative sizes of the channels of transistors 9 and 10. An amplified current on second bit line 11 is thereby produced.

For example, where the ratio of the channel width of P-channel MOS transistor 9 to the channel width of P-channel MOS transistor 10 is 1:5 and the channel lengths are equal, a current amplification factor of five is present. Thus, a current five times the current flowing through memory cell 5 is obtained on second bit line 11. This increased current is easier to distinguish from the no current state, when the other binary information is written into selected memory cell 5, described below. In addition, the increased current more rapidly overcomes the stray capacitance of the second bit line 11 to produce high speed operation.

While memory cell 5 is selected, all of the memory cells which are connected to first bit line 8 are in their OFF state. In addition, the P-channel MOS transistors 9, 10 in current amplification circuit 4 are also in their OFF state. As a result, the current on second bit line 11 is composed solely of the current flowing through selected memory cell 5, which has been multiplied fivefold by current amplification circuit 3.

On the other hand, when memory cell 5 is written as data so that current will not flow between first bit line 7 and ground, i.e. when memory cell 5 is in a permanent OFF state, bit line 7 has no current flow and P-channel MOS transistors 9 and 10 of current amplification of circuit 3 are in the OFF state. Thus, there is no current present on second bit line 11. Thus, the binary data represented by the current or absence of current on second bit line 11 is magnified so that clearer sensing of the binary nature of the data is achieved. Thus, it is possible to connect the memory cells associated with a second bit line to a large number of first bit lines, dividing up the memory cells.

For example, where the number of word lines is 512, as in the memory device described in the article and it is determined to set the number of memory cells connected to each first bit line at 32, 16 separate first bit lines are connected to a second bit line through a current amplification circuit. As a result of this arrangement, the length of each first bit line is 1/16 of the length of the first bit line in the article and likewise, the number of memory cells connected to each first bit line is also 1/16 of the article memory device. This has the additional benefit of causing the stray capacitance of each first bit line to be likewise reduced by a factor of 16. Thus, the first bit line has low stray capacitance and the current is substantially controlled by the small memory cell's ability to allow current to flow. As a result, the second bit line has a third to a quarter of the stray capacitance of the second bit line of the semiconductor memory described in the article and is driven by a larger current resulting from the current amplification. This results in extremely high speed operation being produced. In addition, two P-channel MOS transistors are sufficient for the current amplification circuit. Since only two additional MOS transistors are added for 32 memory cells, they can be incorporated without any increment in the dimension of the chip. The stray capacitance of the first bit line and the second bit line is: $\frac{3}{4}Cb + 1/16Cb = 19/48Cb$ (where Cb is the stray capacitance of the article's memory device. As a result, the overall stray capacitance of the bit line including the first bit line and the second bit line is less than half of that present in the memory circuit described in the article. The power consumption of the bit line driving is also reduced to less than half of that present in the memory circuit described in the article.

Figure 2:
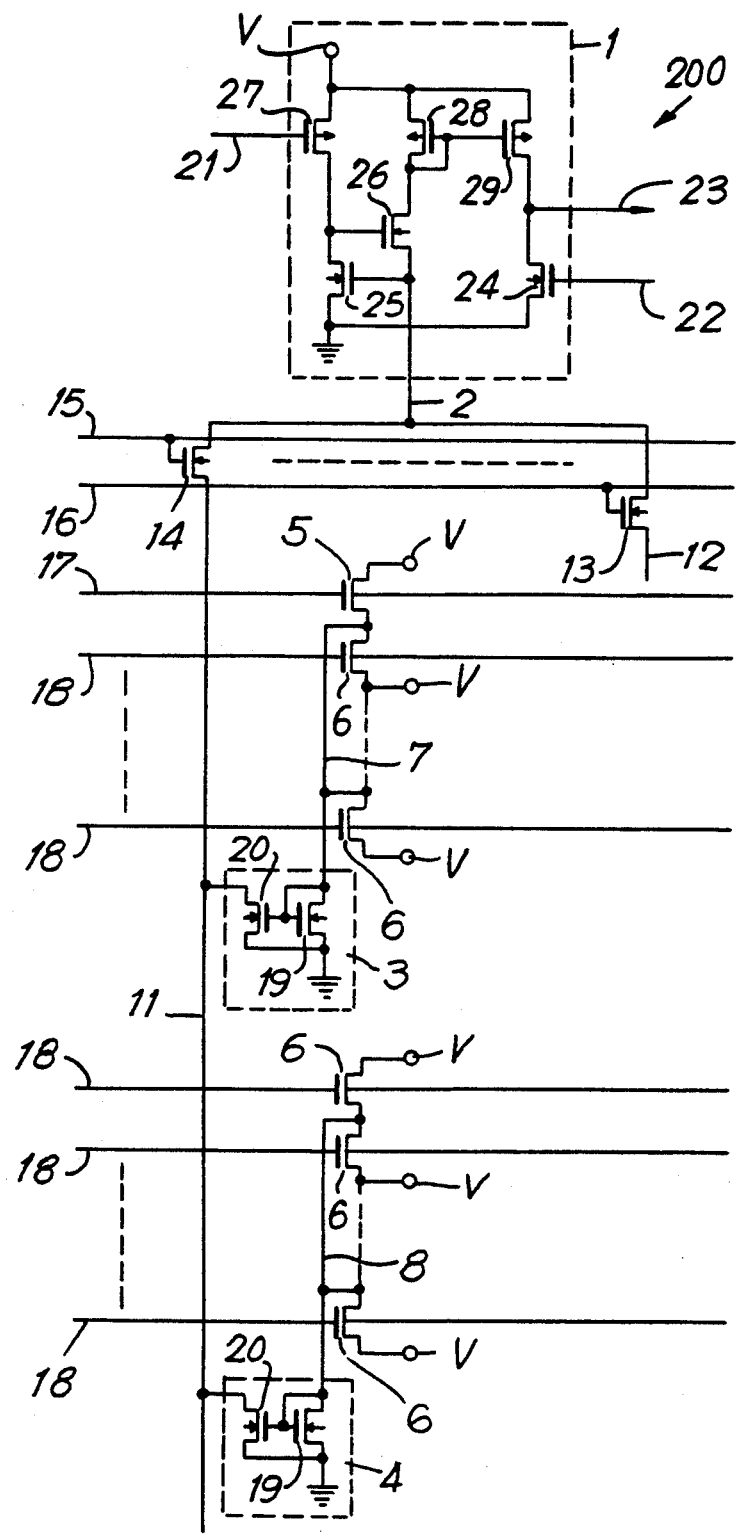
FIG. 2 is a partial circuit diagram of a semiconductor memory device in accordance with a second embodiment of the invention.

Reference is next made to FIG. 2 wherein a second embodiment of the invention is depicted. Like elements are represented by like reference numerals. Memory cells 5, 6 are coupled between power supply terminal voltages V and first bit lines 7 and 8, rather than ground and first bit lines 7 and 8 as in the embodiment of FIG. 1. In addition, current amplification circuits 3, 4 are composed of N-channel transistors 19, 20 rather than the P-channel transistors 9, 10 in semiconductor 100 of FIG. 1. The source-drain path of transistor 19 is coupled between first bit line 7 and ground. The source-drain path of transistor 20 is coupled between second bit line 11 and ground. The gate electrodes of transistors 19 and 20 are coupled together and to first bit line 7.

FIG. 2 shows a representative sensing circuit 1 as including N-channel transistors 24, 25, 26 and P-channel transistors 27, 28 and 29. The source-drain paths of transistors 27 and 25 are connected in TM series between power supply terminal V and ground. Likewise, the source-drain paths of transistors 28 and 26 are connected in series between power supply voltage V and bit line select circuit output terminal 2. The source-drain paths of transistors 29 and 24 are connected in series between power supply voltage V and ground. The gate electrode of transistor 27 is coupled to a control signal 21, which controls the operation of sensing amplifier 1. The gate electrode of transistor 25 is coupled to output terminal 2. The gate electrode of transistor 28 is coupled to the gate electrode of transistor 29 and to the junction between transistors 28 and 26. The gate electrode of transistor 26 is coupled to the junction between transistors 27 and 25. The gate electrode of transistor 24 is coupled to a reference voltage signal 22 which is obtained from a dummy cell or other well known expedient. Output terminal 23 is coupled to the junction between transistors 29 and 24.

P-channel MOS transistor 28 detects the current flow through second bid line 11, which is the current flowing through the selected memory cell which has been current amplified by one of the current amplification circuits 3, 4 and forms a current comparison between the current flowing into P-channel MOS transistor 29 and the current flowing into N-channel MOS transistor 24, to which reference voltage 22 has been applied to the gate electrode. P-channel MOS transistor 27 and N-channel MOS transistors 25 and 26 are negative feedback circuits to stabilize the bit line select circuit and maintain a stable voltage level on second bit line 11.

In semiconductor memory 200 shown in FIG. 2, the current amplification circuit is formed with N-channel MOS transistors, as are the memory cells. As a result, a separation zone between the N-channel and P-channel transistors required in semiconductor memory device 100 shown in FIG. 1, is not required in the memory cell. As a result, the overall dimension of the memory cell array can be further reduced.

Current amplification circuit 3 including N-channel transistors 19 and 20 is configured in a similar fashion to amplification circuit 3 in FIG. 1, including P-channel transistors 9, 10. The width of the channel region of transistor 20 is five times as large as the width of the channel region of transistor 19. As a result, the current passing through transistor 19, which is equal to the current passing through selected memory cell 5, is multiplied by a factor of five. Other ratios of channel width and current amplification can be utilized as appropriate.

Figure 3:
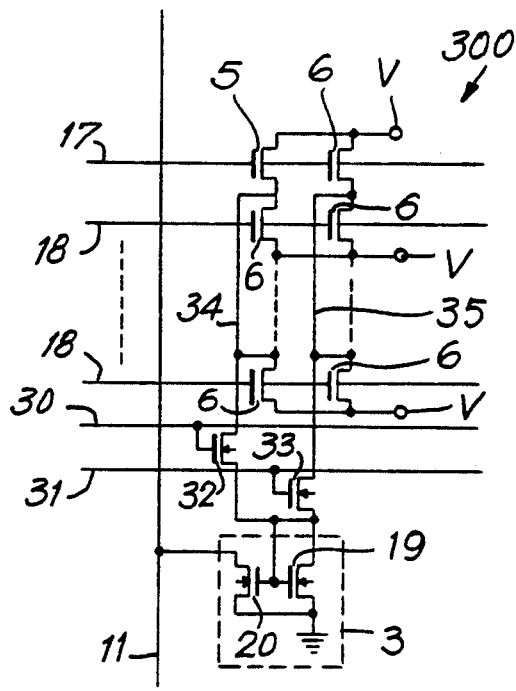
FIG. 3 is a partial circuit diagram of a semiconductor memory device in accordance with a third embodiment of the invention.

Reference is next made to FIG. 3 wherein a semiconductor memory device, generally indicated as 300, constructed in accordance with a third embodiment of the invention is depicted. Like elements are represented by like reference numerals. FIG. 3 is a partial circuit diagram of a semiconductor structure in which a plurality of the first bit lines are connected to a second bit line through a selection circuit and current amplification circuit. Selection lines 30 and 31 are used to select one of first bit lines 34, 35. N-channel MOS transistors, 32, 33 which receive selecting signals 30, 31, respectively connect one of first bit lines 34, 35 to current amplification circuit 3.

Semiconductor memory 300 shown in FIG. 3, utilizes the structure in which two parallel first bit lines 34, 35 are connected to current amplification circuit 3 through a first bit line selection circuit including transistors 32, 33. As a result, a single current amplification circuit 3 is used for two first bit lines 34, 35 and only four additional MOS transistors are utilized in addition to those required for the memory cell array. Thus, only two MOS transistors in addition to those required for the memory cell array are required for each first bit line, the same as required in semiconductor memory device 200 shown in FIG. 2, thereby providing an improved structure without any increase in dimension of the semiconductor memory device.

In the structure shown in FIG. 3, one second bit line is shown connected to two first bit lines. As FIG. 3 is only a partial circuit diagram, considerable numbers of first bit lines may be further added to second bit line 11. In a preferred embodiment, first bit lines 34, 35 are formed by using polycrystalline silicon which is much easier to miniaturize than aluminum or other materials of construction. The second bit line is formed of a metal, which has low resistance, such as aluminum. While it is not easy to miniaturize aluminum, it does not affect the miniaturization of the memory cell itself. The metallic nature of the second bit line does not effect the size of the memory cell because a first bit line and a second bit line are formed as a two layered structure, separated by an insulating layer. The lower side of the insulating film of the second bit line is thickened by using the upper side of the second bit line layer with respect to the semiconductor substrate, thereby reducing the stray capacitance between the wiring layer and the power source, which is the major portion of the stray capacitance of the second bit line. As a result, particularly high speed operation results. Due to the formation of the first bit line and the second bit line in a two-layered structure, the second bit line is formed on the first bit line or the insulating film between the first and second bit lines. Therefore, any number of combinations of first and second bit lines can be formed without increasing the size of the semiconductor memory device.

Figure 4:
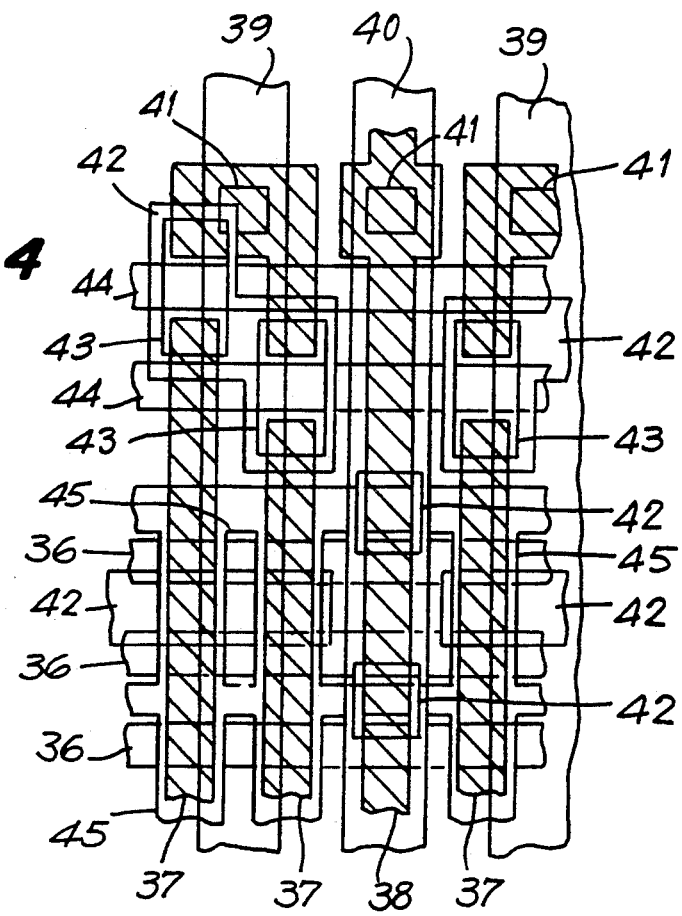
FIG. 4 is a plan view of portion of the memory cell array of a semiconductor device in accordance with the invention.

Reference is next made to FIG. 4 wherein a plan view of the circuit of FIG. 3, utilizing the multi-layer structure, where the first bit line is formed of polycrystalline silicon and the second bit line is formed of aluminum is depicted. FIG. 4 is only a partial showing of the circuit structure of FIG. 3, showing a memory cell and the first bit line select portion. The current amplification circuit is not shown in FIG. 4. Word lines 36 are the gate electrodes of the memory cell transistors. First bit lines 37 are formed of polycrystalline silicon. Polycrystalline silicon portions 28 connect the source electrodes of the MOS transistors. Second bit lines 39 are formed of aluminum and a second source line 40 formed of aluminum connects to the source electrodes. A contact hole 41 connects polycrystalline silicon source line 38 to aluminum source line 40. Contact hole 42 connect the polycrystalline silicon bit lines to the diffusion layer by a buried contact. A difference of the oxide film 43 forms the first bit lines select circuit. Selection line 44 select one of the first bit lines and a difference of the oxide film 45 forms the MOS transistors which are the memory cells.

One method of forming a buried contact is briefly described, although other methods are applicable. After forming the oxide film for the MOS transistor, the gate oxide film is grown. Then, the material from which the gate electrode (and word line) is formed, e.g. polycrystalline silicon, is grown over the entire substrate. Then, an oxide film is grown on top of this. Next, the photoetching of the gate electrode is performed and then the source and drain electrodes are formed by thermal diffusion or ion implantation. If the oxide film is grown all over the substrate, the gate electrode is thicker than the diffusion layer because the oxide film remains on the gate electrode. In this situation, photoetching of the oxide film over the diffusion region is performed with the same technology used for forming LDD (lightly doped drain) structure which is used for extremely miniaturized MOS transistor technology by leaving the oxide film on the side walls of the gate electrode in the hole. Then, polycrystaline silicon is grown in the hole which has been opened above the diffusion region and pattern forming is performed by photoetching. Thereafter, the layer insulating film, contact hole and metal are formed in the same order as in a standard MOS transistor's structure.

After a silicon dioxide insulating layer is grown on the gate electrode and the silicon dioxide is grown all over the surface, photoetching masks are utilized. Then, anisotropic etching is perform. This results in the sides of the gate electrodes adjacent to the contact hole still being covered by an insulating layer. This protects the integrity of the gate electrode and particularly in highly miniaturized transistor structures where destruction of the upper portion of the gate electrode is otherwise possible. Finally, polycrystralline silicon, which forms the bit line (or first source line), is grown, forming a solid accurate buried contact between the diffusion layer and the polycrystalline silicon layer. A buried contact is thus formed in accordance with the self-aligned method which avoids a need for enlargement of circuit elements beyond the scale of the design rule.

As described above, the first bit line is connected in a self-aligned manner to the drain (or source) of the memory cell by a buried contact. Further, the memory cell can be formed to at the minimum size of the design rule of the material used for the gate and the polycrystalline silicon. However, the resistance of polycrystalline silicon is relatively high as compared to metals, such as aluminum. However, in accordance with the present invention, the polycrystalline silicon is only used for the short length of the first bit line, allowing the first bit line being driven by the small currents of the memory cells. On the other hand, the metal forming the longer second bit lines have very low resistance although higher stray capacitance allowing the driving of the second bit lines with large currents which are more easily detected by the sensing amplifier. In addition, the gate electrode is formed of polycrystalline silicon so that the entire memory cell and the first bit lines can be formed at the minimum pitch of the design rule. Therefore, an effective structure for driving the first bit line with relatively small stray capacitance, although relatively large resistance due to the small size of the MOS transistor forming the memory cells (and the resulting impedance) is present. However, the amplification of the current by the amplification circuit between the first and second bit lines results in an effective structure which allows a large current signal to be transmitted along the second bit lines.

Figure 5:
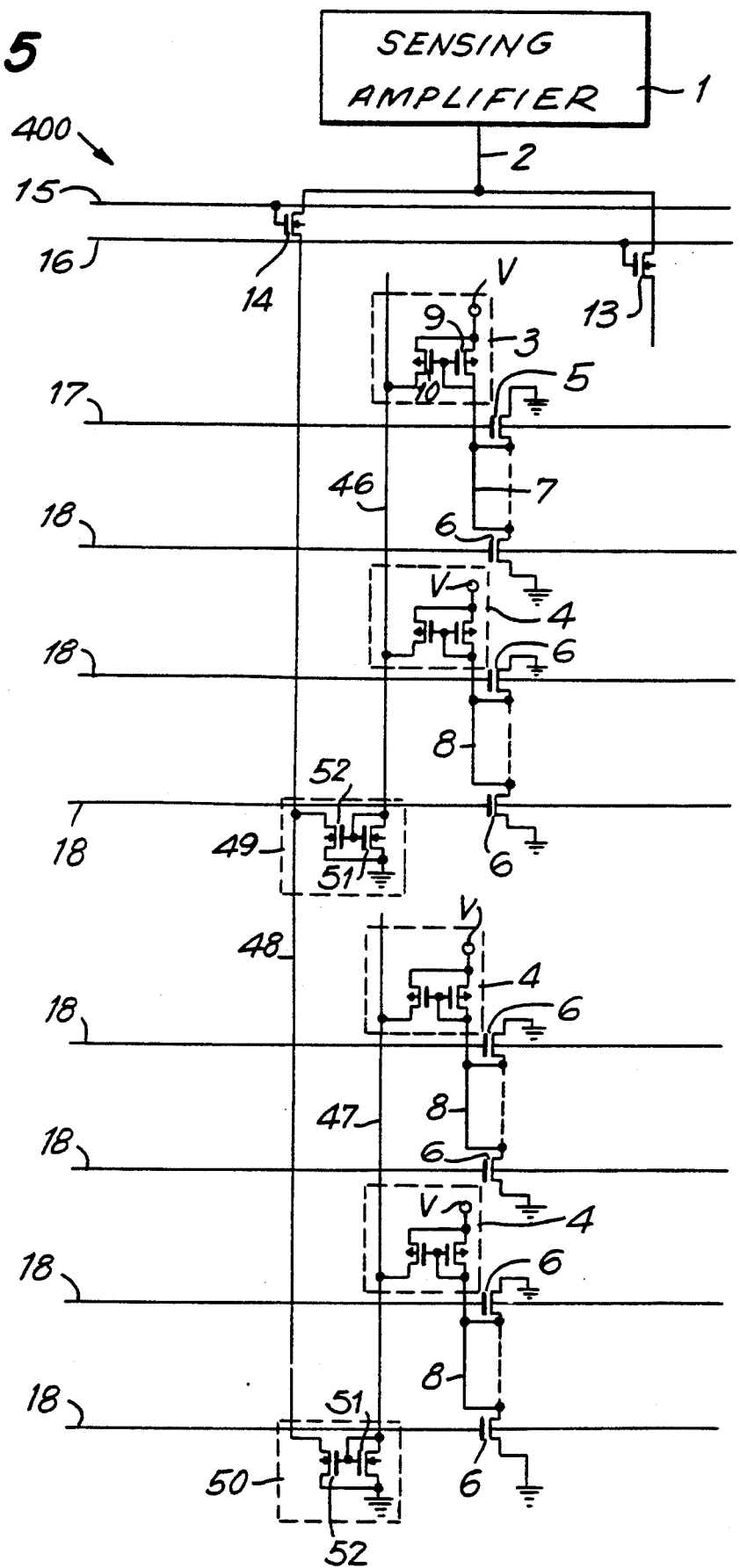
FIG. 5 is a partial circuit diagram showing a portion of a semiconductor memory device constructed in accordance with a fourth embodiment of the invention.

Reference is next made to FIG. 5 wherein a semiconductor memory device, 400 constructed in accordance with a fourth embodiment of the invention is depicted. Semiconductor memory device 400 includes memory cells 5, 6, first bit lines 7, 8 and current amplification circuits 3, 4 as in the embodiment of FIG. 1. However, second bit lines 46 and 47 are coupled to a third bit line 48 through secondary amplification circuits 49, 50. Secondary amplification circuits 49, 50 include N-channel MOS transistors 51 and 52 for use in the same manner as amplification circuit 3 in FIG. 2. In semiconductor memory device 400, second bit lines 46, 47 are connected between the first bit lines 7, 8 which have small amounts of stray capacitance driven by a small current and a third bit line which allows increased miniaturization and an increased current to drive the large stray capacitance on a third bit line. With the current amplified in two successive steps, the current present on third bit line 48 is substantial enough to provide particularly high speed driving of the semiconductor memory device overcoming the slowing effect of the stray capacitance.

Figure 6:
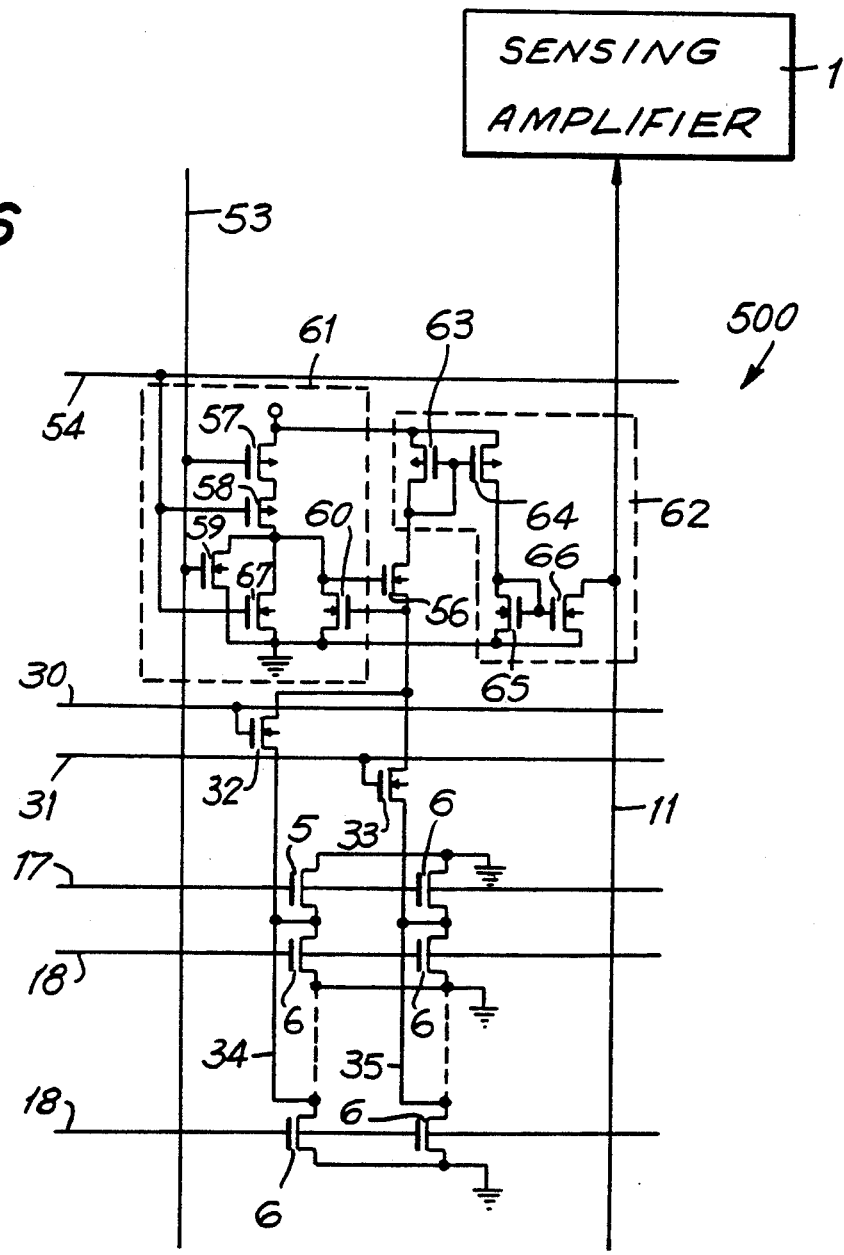
FIG. 6 is a partial circuit diagram of a semiconductor memory device constructed in accordance with a fifth embodiment of the invention.

Reference is next made to FIG. 6 wherein a semiconductor memory device 500, constructed in accordance with a fifth embodiment of the invention is depicted. Like elements are represented by like reference numerals. Semiconductor memory device 500 includes two first bit lines 34, 35 which are connected to a current amplification circuit 62 through selecting N-channel MOS transistors 32 and 33. Transistors 32 and 33 are selected by selection signals 30 and 31, respectively. In addition, an N-channel MOS transistor 56 controls the charge on the first bit line by use of an inverting amplification circuit 61 and the output signal of the inverting amplification circuit which acts as a voltage stabilizing circuit for first bit lines 34 and 35. Current amplification circuit 62 includes two stages. The first stage includes P-channel MOS transistors 63 and 64 and the second stage includes N-channel MOS transistors 65 and 66.

Inverting amplifier 61 includes P-channel MOS transistors 57 and 58 and N-channel MOS transistors 59, 60 and 67. The source-drain paths of transistors 57 and 58 are coupled in series. The source electrode of transistor 57 is coupled to a power supply voltage terminal V. The drain electrode of transistor 58 is coupled to the source electrodes of transistors 59, 60 and 67. The drain electrodes of transistors 59, 60 and 67 are coupled to ground. The power supply and ground also can be viewed as two different power sources at different voltage potentials which together serve as the D.C. power source for the embodiment of FIG. 6. The gate electrodes of transistors 57 and 59 are coupled to selecting signal 53. The gate electrodes of transistors 58 and 67 are coupled to control signal 54. The gate electrode of transistor 60 is coupled to the junction between transistor 56 and the first bit line selection circuit 32, 33. The gate electrode of transistor 56 is coupled to the junction between transistor 58 and transistors 59, 60 and 67. The source-drain path of transistor 56 is coupled between amplifier circuit 62 and first bit line selection circuit 32, 33.

Signal 54 which is an input to inverting amplifier 61, is a control signal which outputs a low level signal when either of the first bit line select signals 30, 31 is at a high level. Likewise, input line 53 goes to a low level when second bit line 11 is selected, i.e. when the second bit line reaches the select level. Signal 53 is a selecting signal for causing inverting amplifier 61 and charge control N-channel MOS transistor 56 to enter their operating states.

Amplifier circuit 62 is a two stage amplification circuit. The first stage of amplification circuit 62 includes transistors 63 and 64 which operate in the same manner as amplification circuit 3 in FIG. 1. The second stage of the amplification circuit includes transistors 65 and 66 and operates in the same manner as amplification circuit 3 in FIG. 2.

When first bit line 34 is at ground as its initial stage and memory cell 5 is selected, with word line 17 and selecting signal 30 becoming high level (which causes selecting signals 53 and 54 to go to a low level), the source voltage of N-channel MOS transistor 56 goes to a low level. As a result, the output of inverting amplifier 61 goes to high level, thereby charging first bit line 34 through current detecting P-channel MOS transistors 63. When the source voltage of N-channel MOS transistor 56 increases, the output of inverting amplifier 61 reduces to a low level, thereby reducing the current flow through transistor 56, maintaining a stable voltage on the first bit lines. When first bit line 34 is at ground potential, "second bit " is also at ground potential.

In the circuit structure of semiconductor memory device 400 shown in FIG. 5, the stray capacitance of the first bit line is significantly reduced by dividing the memory cells among a larger number of first bit lines. However in accordance with the embodiment shown in FIG. 6, a fewer number of first bit lines are utilized, and a charge control circuit is utilized to realize high speed operation and a stable voltage on the first bit lines which have a small stray capacitance. Then, the second bit line is driven by the amplified current flowing in the memory cell, which further increases the operating speed. FIG. 6 shows the inverting amplification circuit 61 and current amplification circuit 62 being coupled to two first bit lines. However, the increase in chip size occasioned by the additional transistors used for inverting amplifier 61 and amplification circuit 62 can be reduced. This is achieved by increasing the number of first bit lines and select circuits, as described in connection with the embodiment of FIG. 3, which reduces the need for additional circuits 61, 62. In addition, due to the charge control circuit, the stray capacitance of the first bit line can be increased without the operating speed suffering as the first bit lines are maintained at an appropriate voltage level for rapid switching of the transistors. Further, the number of inverting amplifier circuits and current amplification circuits can be reduced, thereby further reducing any increase in size of the chip's dimension.

The embodiments described above have been explained with reference to a parallel memory cell structure in which the MOS transistors which forms the memory cell are connected in parallel between the bit line and a power source terminal. However, applicant's invention is also applicable to series-parallel type structures in which groups of the memory cells are connected in series and then to the bit line in parallel. For example, in FIG. 3, two parallel first bit lines are commonly connected to a selection circuit. However, it is possible to also connect upper and lower first bit lines so that four first bit lines are commonly connected. Also, the number of parallel first bit lines can be increased. Various combinations and different techniques utilized in the various embodiments described can be combined to form large capacity, miniaturized, high speed semiconductor memory devices.

Thus, in accordance with the invention an improved structure wherein the bit line is composed of a plurality of first bit lines which are connected to one or more second bit lines through a current amplification circuit to realize high speed operation of the first bit line even if the current flow through the highly miniaturized memory cells is quite small, is provided. In addition, high speed operation is achieved from the second bit line due to the high current present on the second bit line even though the stray capacitance of the second bit line is significantly larger than that present on the first bit lines. The stray capacitance of the second bit line is equal to the capacitance of the wiring, the capacitance of the output portion of each of the separate bit lines and the capacitance of a single first bit line. As a result the stray capacitance of the second bit line is substantially reduced from prior art approaches and the remaining stray capacitance is easily driven at high speed by the amplified current from the memory cell. High speed operation is thus achieved even if the memory cell array is not subdivided along a vast number of first bit lines, without a concurrent significant increase in chip size. The reduction of the stray capacitance on the bit lines also reduces the power consumption due to bit line stray capacitance. In fact, the multi-layer structure bit line achieves the desired high speed operation without an increase in chip dimension. In addition, power consumption is reduced in accordance with the stray capacitance reduction and the reduction in wiring capacitance of the second bit line formed of metal. Further, the formation of the first bit line from polycrystaline silicon, as well as the gate electrode of the MOS transistors forming the memory cell, allows the memory cell to be formed at the minimum size of the design rule, which further aids in miniaturization of the memory device. In addition, the use of the inverting amplifier and bit line charge control MOS transistor added to the current amplification circuit creates voltage stability on the bit line which reduces the need to increase the number of the first bit lines which correspond to a second bit line.

Accordingly, an improved section semiconductor memory device which operates at high speed without increasing the chip dimension with high memory capacity is provided. In addition, the memory device can be constructed in multi-layer structure and the invention is applicable to variety of memory devices such as mask ROM's, EPROM's and EEPROM's.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted is illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor memory device for reading data from a selected memory cell where memory cells are arranged in an array and word lines are coupled to the memory cells for selecting the selected memory cell, the semiconductor memory device comprising:
   a first power source;
   a second power source;
   amplification means for amplifying a current passing through the selected memory cell to produce amplified current and including first amplifying means having first and second transistors for initially amplifying the current and second amplifying means having third and fourth transistors for further amplifying the current amplified by the first amplifying means;
   a data line coupled to the amplification means for carrying the amplified current produced by the amplication means; and
   sensing means electrically coupled to the data line for sensing the data from the selected memory cell;
   wherein the first and second transistors have gates connected together and the third and fourth transistors have gates connected together; and
   wherein current flowing between the first power source and selected memory cell passes through the first transistor, current flowing between the first power source and third transistor passes through the second transistor and is greater in value than the current passing through the first transistor, current flowing between the second transistor and second power source passes through the third transistor and the amplified current produced by the amplification means passes through the fourth transistor and is greater in value than the current passing through the third transistor.

2. The semiconductor memory device of claim 1, wherein the memory cells are electrically coupled to the amplification means.

3. The semiconductor memory device of claim 1 wherein the memory cells are electrically connected to the amplification means in series.

4. The semiconductor memory device of claim 1 further comprising selecting means coupled between the data line and sensing means for selectively connecting a data line to the sensing means.

5. The semiconductor memory device of claim 1 wherein the memory device is a read only memory device.

6. The semiconductor memory device of claim 1 wherein each transistor of the first amplifying means and second amplifying means is a MOS transistor.

7. The semiconductor memory device of claim 6 wherein the current on the data line is amplified by an amplification factor related to the relative widths of the channel regions of the four MOS transistors.

8. The semiconductor memory device of claim 1 wherein a plurality of first bit lines are coupled to the memory cells and further including a MOS transistor coupled between the amplification means and at least one of the first bit lines and charge control means coupled to the at least one of the first bit lines and MOS transistor for controlling the electrical conductivity of the MOS transistor in accordance with the voltage on that first bit line associated with the selected memory cell, thereby stabilizing the voltage on the associated first bit line.

9. A semiconductor memory device for reading data from a selected memory cell where the memory cells are arranged in an array and word lines are coupled to the memory cells for selecting the selected memory cell, the semiconductor memory device comprising:
   amplification means for amplifying a current passing through the selected memory cell and including first amplifying means having P-channel transistors for initially amplifying the current and second amplifying means having N-channel transistors for further amplifying the current amplified by the first amplifying means;
   a first power source;
   a second power source;
   a data line coupled to the amplification means for carrying the amplified current produced by the amplification means; and
   sensing means electrically coupled to the data line for sensing the data from the selected memory cells;
   wherein the first amplifying means and second amplifying means each include a current amplification circuit having a first MOS transistor and a second MOS transistor, the first MOS transistor and second MOS transistor each having a service-drain path and gate electrode and
   wherein the second amplifying means includes an input, the source-drain path of the first MOS transistor of the first amplifying means is coupled between the first power source and the selected memory cell, the source-drain path of the second MOS transistor of the first amplifying means is coupled between the first power source and the input of the second amplifying means and the gate electrodes of the first and second MOS transistors of the first amplifying means are coupled to the selected memory cell.

10. The semiconductor memory device of claim 9 wherein the channel region of the second MOS transistor of the first amplifying means is wider than the channel region of the first MOS transistor of the first amplifying means.

11. The semiconductor memory device of claim 10 wherein the first amplifying stage means includes an output, the source-drain path of the first MOS transistor of the second amplifying means is coupled between the output of the first amplifying means and second power source, the source-drain path of the second MOS transistor of the second amplifying means is coupled between the second power source and the data line and the gate electrodes of the first and second MOS transistors of the second amplifying means are coupled to the output of the first amplifying stage means.

12. The semiconductor memory device of claim 11 wherein the channel region of the second MOS transistor of the second amplifying means is wider than that of the first MOS transistor of the second amplifying means.

13. A semiconductor memory device for reading data from a selected one of a plurality of memory cells the memory cells being arranged in an array with first bit lines and word lines being coupled to the memory cells wherein the word lines are operable for selecting the selected memory cell, the semiconductor memory device comprising:
   a plurality of first bit lines, each first bit line being coupled to a group of memory cells, and adapted to carry a current passing through the selected memory cell;
   selection means for selecting one first bit line and the corresponding memory cell group coupled to the selected one of a plurality of first bit lines;
   amplification means having first, second, third and fourth transistors for amplifying the current passing through the selected memory cell and producing amplified current;
   a first power source;
   a second power source;
   a second bit line coupled to the amplification means for carrying the amplified current produced by the amplification means; and
   sensing means coupled to the second bit line for sensing the current on the second bit line;
   wherein each transistor includes a source-drain path and a gate;
   wherein the gates of the first and second transistors are coupled together and to the selected memory cell, the gates of the third and fourth transistors are coupled together and to the second transistor and the source-drain paths of the second and third transistors are coupled in series between the first power source and second power source;
   wherein the source drain path of the first transistor is coupled between the first power source and selected memory cell for flow of current between the first power source and selected memory cell through the first transistor and the source-drain path of the fourth transistor is coupled between the second power source and second bit line for flow of the amplified current through the fourth transistor; and
   wherein the memory cells and third and fourth transistors are n-channel transistors and the first and second transistors are P-channel transistors.

14. The semiconductor memory device of claim 13 wherein the first bit lines include one of the source and drain electrodes of each memory cell.

15. The semiconductor memory device of claim 13 further including an additional MOS transistor coupled between the amplification means and the first bit lines and charge control means coupled to the first bit lines and additional MOS transistor in accordance with the voltage on the selected first bit line, thereby establishing the voltage on the first bit lines.

16. The semiconductor memory device of claim 15 wherein the charge control means includes an inverting amplifier.

17. The semiconductor memory device of claim 13 wherein the first, second, third and fourth transistors are coupled between the selected first bit line and the second bit line for amplifying the current on the selected first bit line and producing a current on the second bit line which is a multiple of the current flowing on the selected first bit line.

18. The semiconductor memory device of claim 13 wherein the first bit lines and the second bit lines are formed as separate layers, separated by an insulating layer.

19. A semiconductor memory device for reading data from a selected one of a plurality of memory cells including a first power source, the memory cells being arranged in an array and first bit lines and word lines being coupled to the memory cells wherein the word lines are operable for selecting the selected memory cell, the semiconductor memory device comprising:
a plurality of first bit lines, each first bit line being coupled to a group of memory cells, and adapted to carry a current passing through the selected memory cell;
selection means for selecting one first bit line and the corresponding memory cell group coupled to the selected one of a plurality of first bit lines;
amplification means coupled to the selected first bit line through the selection means for amplifying the current passing through the selected first bit line;
a second bit line coupled to the amplification means for carrying the amplified current produced by the amplification means; and
sensing means coupled to the second bit line for sensing the current on the second bit line;
wherein the amplification means includes a first amplifying means and a second amplifying means; and
further including a second power source wherein the first amplifying means and the second amplifying means each include a first MOS transistor and a second MOS transistor, the first MOS transistor and the second MOS transistor each having a source-drain path and gate electrode, the second amplifying means including an input, the source-drain path of the first MOS transistor of the first amplifying means being coupled between the second power source and the selected memory cell, the source-drain path of the second MOS transistor of the first amplifying means being coupled between the second power source and the input of the second amplifying means and the gate electrodes of the first and second MOS transistors being coupled to the selected memory cell.

20. The semiconductor memory device of claim 19 wherein the MOS transistors of the second amplifying means are N-channel transistors and the channel region of the second MOS transistor of the first amplifying means is wider than the channel region of the first MOS transistor of the first amplifying means to amplify current on the selected first bit line.

21. A semiconductor memory device for reading data from a selected one of a plurality of memory cells, the memory cells being arranged in an array with a first bit line and word lines coupled to the memory cells wherein the word lines are operable for selecting the selected memory cell, the semiconductor memory device comprising:
a first bit line coupled to a group of memory cells for carrying a current passing through the selected memory cell;
a first power source;
a second power source;
amplification means for amplifying the current passing through the selected memory cell to produce amplified current and including first amplifying means having first and second transistors for initially amplifying the current and second amplifying means having third and fourth transistors for further amplifying the current amplified by the first amplifying means;
a second bit line coupled to the amplification means for carrying the amplified current; and
sensing means coupled to the second bit line for sensing the amplified current on the second bit line;
wherein the first and second transistors have gates connected together and the third and fourth transistors have gates connected together; and
wherein current flowing between the first power source and selected memory cell passes through the first transistor, current flowing between he first power source and third transistor pass through the second transistor and is greater in value than the current passing through the first transistor, current flowing between the second transistor and second power source passes through the third transistor and the amplified current produced by the amplification means passes through the fourth transistor and is greater in value than the current passing through the third transistor.

22. The semiconductor memory device of claim 21 wherein the amplification means includes a two stage current amplifier, said first and second transistors included within the first stage and said third and fourth transistors included within the second state of the two stage current amplifier.

23. The semiconductor memory device of claim 21 wherein there are a plurality of first bit lines.

24. The semiconductor memory device of claim 21 wherein each memory cell is formed of a MOS transistor.

25. The semiconductor memory device of claim 24 wherein each MOS transistor has a source-drain path each source-drain path is coupled between the first bit line and a reference voltage and each gate is coupled to a word line.

26. The semiconductor memory device of claim 25 wherein the reference voltage is ground.

27. The semiconductor memory device of claim 24 wherein the first bit line is coupled to one of the source and drain electrodes of the MOS transistors forming the memory cell.

28. The semiconductor memory device of claim 21 wherein the third and fourth transistors are MOS transistors, the source-drain path of the third transistor being coupled between the first bit line and ground, the source-drain path of the fourth transistor being coupled between the second bit line and ground and the gates of the third and fourth transistors being coupled to the first bit line.

29. The semiconductor memory device of claim 21 wherein the sensing means includes a comparator circuit for comparing the current on the second bit line with a reference current level.

30. The semiconductor memory device of claim 28 further comprising a MOS transistor coupled between the amplification means and the first bit line and charge control means coupled to the first bit line and MOS transistor for controlling the electrical conductivity of the MOS transistor in accordance with the voltage on the first bit line, thereby stabilizing the voltage on the first bit line.

31. The semiconductor memory device of claim 30 wherein the charge control means includes an inverting amplifier.

32. The semiconductor emory device of claim 21 wherein a plurality of the memory cells are coupled to the first bit line in parallel.

33. The semiconductor memory device of claim 21 wherein a plurality of the memory cells are coupled to the first bit line in series.

34. A semiconductor memory device for reading data from a selected one of a plurality of memory cells including a first power source, the memory cells being arranged in an array with a first bit line and word lines coupled to the memory cells wherein the word lines are operable for selecting the selected memory cell, the semiconductor memory device comprising:
- a first bit line coupled to a group of memory cells for carrying a current passing through the selected memory cell;
- amplification means coupled to the first bit line for amplifying the current on the first bit line;
- a second bit line coupled to the amplification means for carrying the amplified current;
- sensing means coupled to the second bit line for sensing the amplified current on the second bit line; and
- a second power source;
- wherein the amplification means includes first stage amplifying means having an output and a first P-channel MOS transistor and a second P-channel MOS transistor and second stage amplifying means having an output and a first N-channel MOS transistor and a second N-channel MOS transistor, each transistor of the first stage amplifying means and second stage amplifying means having a source-drain path and a gate electrode, the source-drain path of the first P-channel MOS transistor of the first stage amplifying means being coupled between the second power source and the first bit line and the source-drain path of the second P-channel MOS transistor of the first stage amplifying means being coupled between the power source and the output of the first stage amplifying means, the source-drain path of the first N-channel MOS transistor of the second stage amplifying means being coupled between the output of the first stage amplifying means and the first power source and the source-drain path of the second N-channel MOS transistor of the second stage amplifying means being coupled between the first power source and the output of the second stage amplifying means, the gate electrodes of the first and second P-channel MOS transistors of the first stage amplifying means being coupled to the selected memory cell and the gate electrodes of the first and second N-channel MOS transistors of the second stage amplifying means being occupied to the output of the first stage amplifying means.

35. The semiconductor memory device of claim 34 wherein the channels of the second P-channel MOS transistor and second N-channel MOS transistor are wider than the channels of the first P-channel MOS transistor and the first N-channel MOS transistor, respectively, the degree of amplification being related to the relative widths of the channel regions.

36. A semiconductor memory device for reading data from a selected one of a plurality of memory cells including a first power source and a second power source, the memory cells being arranged in an array with a first bit line the word lines being coupled to the memory cells wherein the word lines are operable for selecting the selected memory cell, the semiconductor memory device comprising:
- a first bit line coupled to a group of memory cells for carrying a current passing through the selected memory cell;
- amplification means coupled to the first bit line for amplifying the current on the first bit line;
- a second bit line coupled to the amplification means for carrying the amplified current; and
- sensing means coupled to the second bit line for sensing the amplified current on the second bit line;
- wherein each memory cell includes a MOS transistor having a source-drain path and a gate electrode, each source-drain path is coupled between the first bit line and a reference voltage and each gate electrode is coupled to a word line; and
- wherein the amplification means include first stage amplifying means having an output and a first P-channel MOS transistor and a second P-channel MOS transistor and second stage amplifying means having an output and a first N-channel MOS transistor and a second N-channel MOS transistor, each transistor of the first stage amplifying means and second stage amplifying means having a source-drain path and a gate electrode, the source-drain path of the first P-channel MOS transistor of the first stage amplifying means being occupied between the second power source and the first bit line and the source-drain path of the second P-channel MOS transistor of the first stage amplifying means being coupled between the second power source and the output of the first stage amplifying means, the source-drain path of the first N-channel MOS transistor of the second stage amplifying means being coupled between the output of the first stage amplifying means and the first power source and the source-drain path of the second N-channel MOS transistor of the second stage amplifying means being coupled between the first power source and the output of the second stage amplifying means and the gate electrodes of the first and second P-channel transistors of the first stage amplifying means being coupled to the selected memory cell and the gate electrodes of the first and second N-channel MOS transistors of the second stage amplifying means being coupled to the output of the first stage amplifying means.

37. The semiconductor memory device of claim 36 wherein the channel region of the second P-channel MOS transistor of the first stage amplifying means and the second N-channel MOS transistor of the second stage amplifying means are wider than the channels of the first P-channel MOS transistor of the first stage amplifying means and the first N-channel MOS transistor of the second stage amplifying means, respectively, the degree of amplification being related to the relative widths of the channel regions.

38. A semiconductor memory device for reading data from a selected one of a plurality of memory cells including a first power source and a second power source, the memory cells being arranged in an array with a first bit line and word lines coupled to the memory cells wherein the word lines are operable for selecting the selected memory cell, the semiconductor memory device comprising:
- a first bit line coupled to a group of memory cells for carrying a current passing through the selected memory cell;
- amplification means coupled to the first bit line for amplifying the current on the first bit line;
- a second bit line coupled to the amplification means for carrying the amplified current; and
- sensing means coupled to the second bit line for sensing the amplified current on the second bit line;
- wherein the amplification means includes first and second amplifying means;
- wherein the first amplifying means includes an output, a first transistor and a second transistor, each transistor having a source-drain path, the source-drain path of the first transistor being coupled between the first bit line and the second power source and the source-drain path of the second transistor being coupled between the second power source and the output of the first amplifying means.

39. The semiconductor memory device of claim 38 wherein the second amplifying means includes an output, a first transistor and a second transistor, each transistor having a source-drain path, the source-drain path of the first transistor of the second amplifying means being coupled between the output of the first amplifying means and the first power source and the source-drain path of the second transistor of the second amplifying means being coupled between the first power source and output of the second amplifying means.

40. The semiconductor memory device of claim 39 wherein the first and second transistors of the first amplifying means are P-channel MOS transistors and the first and second transistors of the second amplifying means are N-channel transistors.

41. A semiconductor memory device for reading data from a selected one of a plurality of memory cells where the memory cells are arranged in an array and word lines are coupled to the memory cell, the semiconductor memory device comprising:
- a plurality of first bit lines, each first bit line coupled to a plurality of memory cells for carrying the current passing through the selected memory cell;
- selection means coupled to a plurality of first bit lines for selecting one of the first bit lines;
- a two stage current amplifier including a first amplification means and a second amplification means, the first amplification means including P-channel transistors, the second amplification means including N-channel transistors, each transistor having a source-drain path and a gate electrode, the gate electrodes of the N-channel transistors being connected together and the gate electrodes of the P-channel transistors being connected together, said first amplification means coupled to the selection means for amplifying the current on the selected first bit line;
- a MOS transistor coupled between the first amplification means and the selected first bit line;
- charge control means for detecting the voltage of the selected first bit line and for controlling current flow through the MOS transistor based on the voltage of the selected first bit line detected by the charge control means to raise the voltage of the selected first bit line;
- a second bit line coupled to said second amplification means for receiving the amplified current from said first amplification means; and
- sensing means coupled to the second bit line for sensing the current on the second bit line.

42. The semiconductor memory device of claim 41 further including means for producing a select signal and wherein the selection means includes a MOS transistor for each of the first bit lines, the source-drain path of each MOS transistor being coupled between the first bit line and the charge control means and each gate electrode being coupled to the means for producing a select signal.

43. The semiconductor memory device of claim 41 wherein each memory cell is framed of a MOS transistor.

44. The semiconductor memory device of claim 43 wherein the selected first bit line is formed as one of the source and drain electrodes of the MOS transistors forming the memory cells.

45. The semiconductor memory device of claim 41 wherein the charge control means is activated by selection of the first and second bit lines.

46. The semiconductor memory device of claim 41 wherein the amplification means includes a two stage current amplifier.

47. A semiconductor memory device for reading data from a selected one of a plurality of memory cells where the memory cells are arranged in an array and word lines are coupled to the memory cell, the semiconductor memory device comprising:
- a plurality of first bit lines, each first bit line coupled to a plurality of memory cells for carrying the current passing through the selected memory cell;
- selection means coupled to a plurality of first bit lines for selecting one of the first bit lines;
- amplification means coupled to the selection means for amplifying the current on the selected first bit line, the amplification means including a current amplifier including two MOS transistors, the source-drain path of the first transistor being coupled between a reference voltage and the selected first bit line, the source-drain path of the second transistor being coupled between the reference voltage and the second bit line and the gate electrodes of the transistors being coupled to the selected first bit line;
- a MOS transistor coupled between the amplification means and the selected first bit line;
- charge control means for detecting the voltage of the selected first bit line and for controlling current flow through the MOS transistor based on the voltage of the selected first bit line detected by the charge control means to raise the voltage of the first bit line;
- a second bit line coupled to the amplification means for receiving the amplified current; and
- sensing means coupled to the second bit line for sensing the current on the second bit line.

48. The semiconductor memory device of claim 47 wherein the channel of the second transistor is wider than the channel of the first transistor, the degree of amplification being related to the relative widths of the channels.

49. A semiconductor memory device for reading data from a selected one of a plurality of memory cells where the memory cells are arranged in an array and word lines are coupled to the memory cell, the semiconductor memory device comprising:

a plurality of first bit lines, each first bit line coupled to a plurality of memory cells for carrying the current passing through the selected cell;

selection means coupled to a plurality of first bit lines for selecting one of the first bit lines;

amplification means coupled to the selection means for amplifying the current on the selected first bit lines, the amplification means including two MOS transistors, the source-drain path of the first transistor being coupled between the selected first bit line and ground, the source-drain path of the second transistor being coupled between the second bit line and ground and the gate electrodes of the transistors being coupled to the selected first bit line;

a MOS transistor coupled between the amplification means and the selected first bit line;

charge control means for detecting the voltage of the selected first bit line and for controlling current flow through the MOS transistor based on the voltage of the selected first bit line detected by the charge control means to raise the voltage of the selected first bit line;

a second bit line coupled to the amplification means for receiving the amplified current; and sensing means coupled to the second bit line for sensing the current on the second bit line.

50. The semiconductor memory device of claim 49 wherein the channel of the second transistor is wider than the channel of the first transistor and the amplification factor of the amplification means is related to the relative widths of the channels.

51. A semiconductor memory device for reading data from a selected one of a plurality of memory cells where the memory cells are arranged in an array and word lines are coupled to the memory cell, the semiconductor memory device comprising:

a plurality of first bit lines, each first bit line coupled to a plurality of memory cells for carrying the current passing through the selected memory cell;

selection means occupied to a plurality of first bit lines for selecting one of the first bit lines;

amplification means coupled to the selection means for amplifying the current on the selected first bit line;

a MOS transistor coupled between the amplification means and the selected first bit line, the mos transistor having a source-drain path and a gate electrode;

charge control means for detecting the voltage of the selected first bit line and for controlling current flow through the MOS transistor based on the voltage of the selected first bit line detected by the charge control means to raise the voltage of the selected first bit line, the source-drain path of the MOS transistor being coupled between the selected first bit line, through the selection means, and the amplification means and the gate electrode being coupled to the charge control means;

a second bit line coupled to the amplification means for receiving the amplified current; and sensing means coupled to the second bit line for sensing the current to the second bit line.

52. A semiconductor memory device for reading data from a selected one of a plurality of memory cells where the memory cells are arranged in an array and word lines are coupled to the memory cell, the semiconductor memory device comprising:

a plurality of first bit lines, each first bit line coupled to a plurality of memory cells for carrying the current passing through the selected memory cell;

selection means coupled to a plurality of first bit lines for selecting one of the first bit lines;

amplification means coupled to the selection means for amplifying the current on the selected first bit line;

a MOS transistor coupled between the amplification means and the selected first bit line;

charge control means including an inverting amplifier for detecting the voltage of the selected first bit line and for controlling current flow through the MOS transistor based on the voltage of the selected first bit line detected by the charge control means to raise the voltage of the selected first bit line;

a second bit line coupled to the amplification means for receiving the amplified current; and sensing means coupled to the second bit line for sensing the current on the second bit line.

53. A semiconductor memory device for reading data from a selected one of a plurality of memory cells including a first power source, the memory cells being arranged in an array and first bit lines and word lines being coupled to the memory cells wherein the word lines are operable for selecting the selected memory cell, the semiconductor memory device comprising:

a plurality of first bit lines, each first bit line being coupled to a group of memory cells and adapted to carry a current passing through the selected memory cell;

selection means for selecting one first bit line and the corresponding memory cell group coupled to the selected one of a plurality of first bit lines;

amplification means coupled to the selected first bit line through the selection means for amplifying the current passing through the selected first bit line;

a second bit line coupled to the amplification means for carrying the amplified current produced by the amplification means; and sensing means coupled to the second bit line for sensing the current on the second bit line;

wherein the amplification means includes two N-channel MOS transistors, the source-drain path of the first MOS transistor being coupled between a first bit line and ground, the source-drain path of the second transistor being coupled between the second bit line and ground and the gate electrodes of the two transistors being coupled to the first bit line.

54. The semiconductor memory device of claim 53, wherein the first power source is ground and the second power source is a power supply.

55. A semiconductor memory device for reading data from a selected one of a plurality of memory cells including a first power source and a second power source, the memory cells being arranged in an array with a first bit line and word lines coupled to the memory cells wherein the word lines are operable for selecting the selected memory cell, the semiconductor memory device comprising:

a first bit line coupled to a group of memory cells for carrying a current passing through the selected memory cell;

amplification means coupled to the first bit line for amplifying the current on the first bit line and including a two stage current amplifier;

a second bit line coupled to the amplification means for carrying the amplified current; and sensing means coupled to the second bit line for sensing the amplified current on the second bit line;

wherein the two stage amplifier includes a first stage current amplifier including first and second MOS transistors and a second stage current amplifier including third and fourth MOS transistors, the source-drain path of the first transistor is coupled between the first bit line and the first power source, the source-drain path of the second transistor is coupled between the first power source and a source-drain path of the third transistor, the source-drain path of the third transistor is coupled between the source-drain path of the second transistor and the second power source, the source-drain path of the fourth transistor is coupled between the second power source and the second bit line, the gates of the first and second transistors are coupled to the first bit line, and the gates of the third and fourth transistors are coupled to the second transistor.

56. The semiconductor memory device of claim 55 wherein the first bit line and the second bit line are formed as separate layers, separated by an insulating layer.

* * * * *